United States Patent [19]

Oberhammer et al.

[11] Patent Number: 6,031,478
[45] Date of Patent: Feb. 29, 2000

[54] DYNAMIC RANGE EXTENSION OF WIDEBAND RECEIVER

[75] Inventors: Wolfgang Oberhammer, Ottawa; Bixia Li, Nepean, both of Canada

[73] Assignee: Nortel Networks Corporation, Montreal, Canada

[21] Appl. No.: 09/025,831

[22] Filed: Feb. 19, 1998

[51] Int. Cl.[7] .................................................. H03M 1/12
[52] U.S. Cl. ........................................ 341/155; 341/139
[58] Field of Search .................................. 341/141, 139, 341/155, 159

[56] References Cited

U.S. PATENT DOCUMENTS

| | | | |
|---|---|---|---|
| 4,129,864 | 12/1978 | Carpenter et al. | 341/139 |
| 4,482,916 | 11/1984 | Acampora | 358/27 |
| 4,618,850 | 10/1986 | Lenhoff, Jr. | 340/347 |
| 4,652,882 | 3/1987 | Shovlin et al. | 342/150 |
| 4,999,628 | 3/1991 | Kakubo et al. | 341/139 |
| 5,111,202 | 5/1992 | Rivera et al. | 341/139 |
| 5,373,295 | 12/1994 | Michon | 341/159 |
| 5,422,643 | 6/1995 | Chu et al. | 341/141 |
| 5,442,575 | 8/1995 | Gast et al. | 364/602 |
| 5,684,480 | 11/1997 | Jansson | 341/139 |

OTHER PUBLICATIONS

12–Bit, 65 MSPS Monolithic A/D Converter, Preliminary May 17, 1997, Ananlog Devices, pp. 1 to 10.

*Primary Examiner*—Brian Young
*Assistant Examiner*—Peguy JeanPierre

[57] ABSTRACT

A digitizer with increased dynamic range is provided by applying varying gains/attenuations to an input signal and feeding the resulting scaled signals to several conventional analog-to-digital converters to be digitized. The digitized version of the largest scaled signal which does not result in its respective analog-to-digital converter from saturating is selected by a multiplexer to be fed through as the digitizer output. Each of the gains(attenuations) differ by multiples of approximately 6 dB, since one bit in an ADC represents this value. The multiplexer outputs a digital sample size which is larger than that of the analog-to-digital converters and with the selected digitized version being output as the appropriate subset of the larger sample size to account for the gain (attenuation) of the selected signal. Preferably, this is used in a wideband receiver to increase the dynamic range of the receiver.

19 Claims, 8 Drawing Sheets

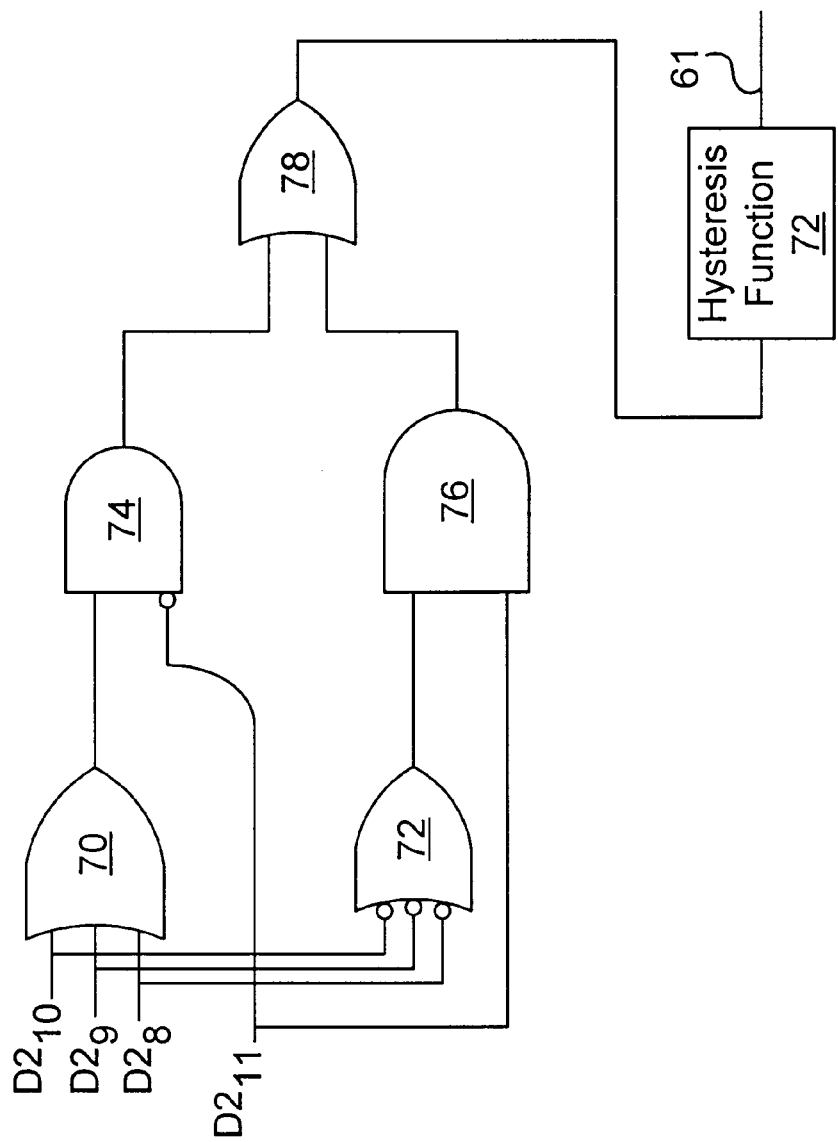

DYNAMIC RANGE EXTENSION OF WIDEBAND RECEIVER

FIELD OF THE INVENTION

The invention relates to analog-to-digital converters with expanded dynamic range, and to wideband receivers incorporating such analog-to-digital converters.

BACKGROUND OF THE INVENTION

It is a problem with existing wideband radios in basestations that they include ADCs (analog-to-digital converters) which do not have sufficient dynamic range to simultaneously handle properly the large signal strengths from mobiles which are close to the basestation and the small signal strengths from mobiles which are far from the basestation close to the basestation's cell boundary. Typically, when the signal strength becomes too large, the ADC saturates, and outputs a digital signal which contains no useful information.

Some existing systems attempt to overcome this problem through the use of AGC (automatic gain control) in which a variable attenuator is used to insert a variable loss in the analog signal before it is digitized. Due to the dynamic range required and the lower frequency limit of PIN diode switches, AGC cannot be implemented at baseband, and implementing the AGC at RF (radio frequency) would degrade the noise figure of the receiver unduly. A compromise solution involves using the AGC at the IF (intermediate frequency). Such a solution has at least three problems. Firstly, a significant noise figure degradation results due to the limited amount of gain in front of the variable attenuator. Adding more gain in front of the attenuator is not feasible due to the linearity constraint of subsequent components. Secondly, the overload is easiest detected at the digital side of the ADC. By the time the overload is detected, a finite amount of signal is lost due to ADC overload, and clicks are detected at audio. In addition, data is lost in CDPD (cellular digital packet data) and modem applications. Thirdly, the circuit implementation is complex and costly.

In U.S. Pat. No. 5,422,643 which issued Jun. 6, 1995 to Chu et al., an ADC with expanded dynamic range is proposed wherein the analog signal is duplicated in a plurality of channels each with a different attenuation or gain inserted. Then, depending upon the amplitude of the signal, a particular channel is chosen such that the resulting compensated signal will not saturate the ADC but will be close to full scale of the ADC. At the output of the ADC, the digitized signal must be adjusted-to reflect the attenuation or gain inserted. The circuitry for selecting the particular analog channel is complex and requires complicated calibration procedures. Furthermore, there is no suggestion in Chu et al. that this type of ADC would be appropriate for use in a wideband receiver context.

SUMMARY OF THE INVENTION

It is an object of the invention to obviate or mitigate one or more of the above identified disadvantages.

According to a first broad aspect, the invention provides a digitizer with increased dynamic range having an analog input and a digitized output consisting of P-bit samples, the digitizer comprising: a gain(attenuation) stage having N channels, each for applying a respective gain or attenuation to said analog input to produce a respective scaled analog signals, where N is an integer greater than or equal to two; N M-bit analog-to-digital converters, each connected to receive a respective one of said scaled analog signals, each for producing a respective M-bit digital sample of the respective scaled analog signal, where M is the sample bit length of the analog-to-digital converters; a switching circuitry connected to receive as inputs all of said M-bit digital samples, for outputting a P-bit sample as a function of a selected one of the M-bit digital samples, where P>M; and an overload detect circuit for selecting the selected one of said M-bit digital samples.

In another embodiment, a wideband receiver is provided which has increased dynamic range due to the inclusion of the above summarized digitizer.

BRIEF DESCRIPTION OF THE DRAWINGS

Preferred embodiments of the invention will now be described with reference to the attached drawings in which:

FIG. 4C is a block diagram of the overload detect circuit appearing in FIGS. 4A and 4B;

DETAILED DESCRIPTION OF THE PREFERRED EMBODIMENTS

Figure 1:
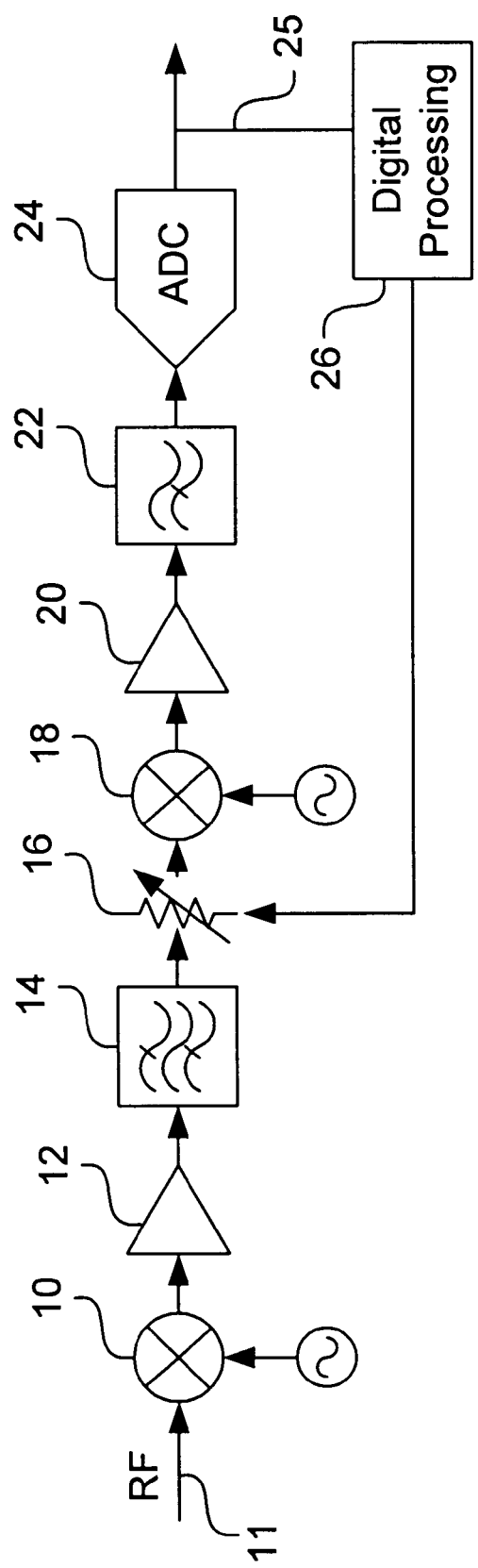
FIG. 1 is a block diagram of a conventional wideband receiver.

Referring firstly to FIG. 1, a conventional wideband receiver in which AGC is implemented at IF is shown to comprise, connected together in sequence, an RF mixer 10 which has an RF input signal 11, a buffer 12, a filter 14, AGC stage 16, an IF mixer 18, a second buffer 20, a second filter 22, and an ADC 24. The ADC 24 has an output 25 connected to a digital processing block 26 which in turn has an output which controls a gain or attenuation introduced by the AGC stage 16. The problems with such an arrangement have been detailed above.

Figure 2:
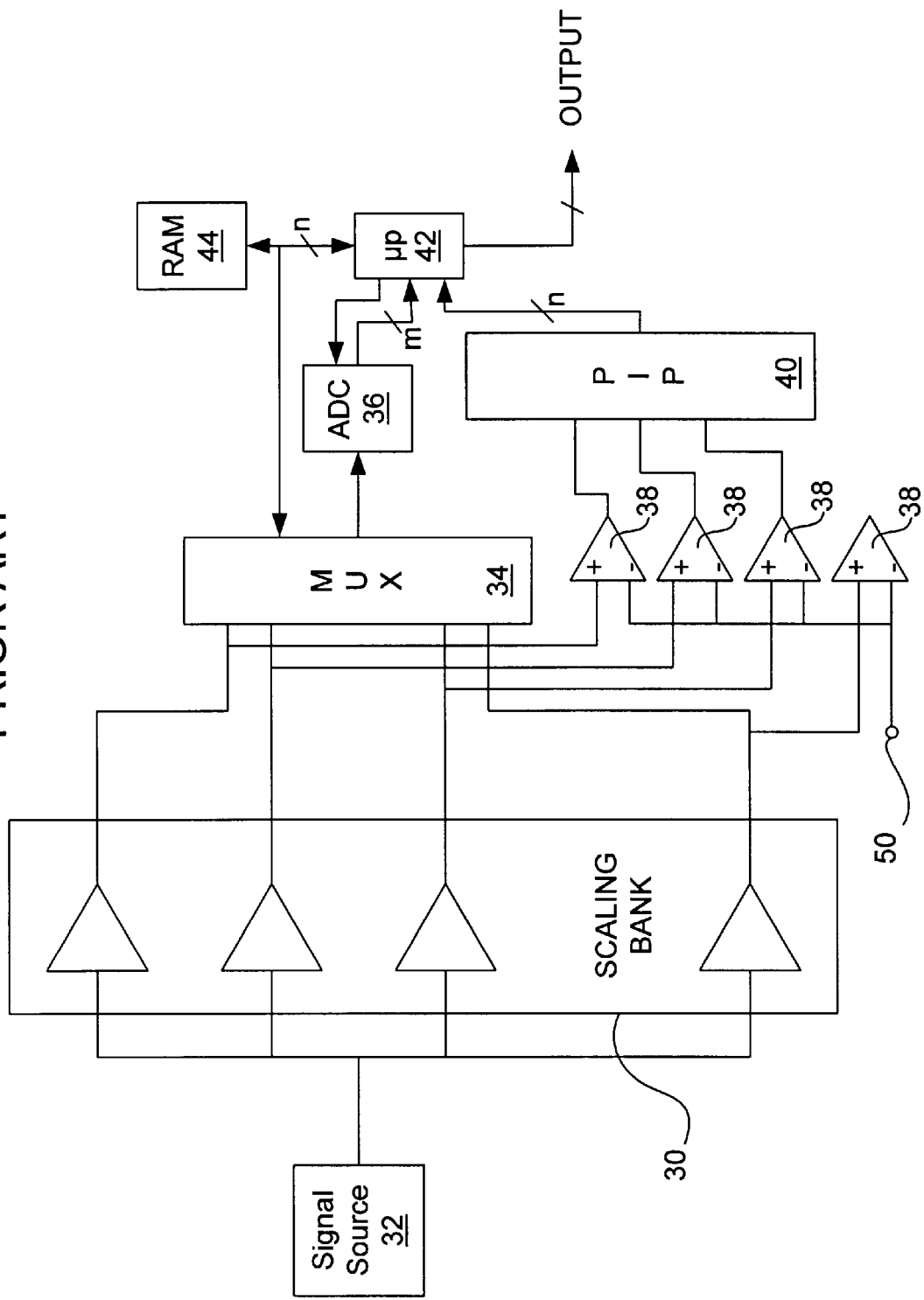
FIG. 2 is a block diagram of a known digitizer with expanded dynamic range.

Referring now to FIG. 2, a digitizer disclosed in the above-mentioned U.S. Pat. No. 5,422,643 is shown, this Figure being a simplified version of FIG. 1 of that patent, and includes a scaling bank 30 which applies four different of gains/attenuations to a signal received from a signal source 32. The scaling bank 30 produces four scaled signals which are passed to a multiplexer 34 which passes a single one of them to an ADC 36. The four scaled signals are also each passed through four respective analog comparators 38 which have outputs which are fed through a PIP (parallel interface port) 40 and ultimately to a microprocessor 42. The microprocessor 42 makes a selection of which scaled signal to use on the basis of the outputs of the comparators 38 and on the basis of calibration information stored in a RAM (random access memory) 44. In addition, the microprocessor 44 performs some adjustment on the digitized signal produced by the ADC 36 to account for the gain or attenuation in the selected signal. This adjustment is referred to as "compression" or "expansion" in the description, but no details of how this is achieved are provided. As identified previously, this system requires a complex calibration procedure. The need for a plurality of analog comparators, a microprocessor and RAM also makes this implementation expensive and complicated.

Figure 3:
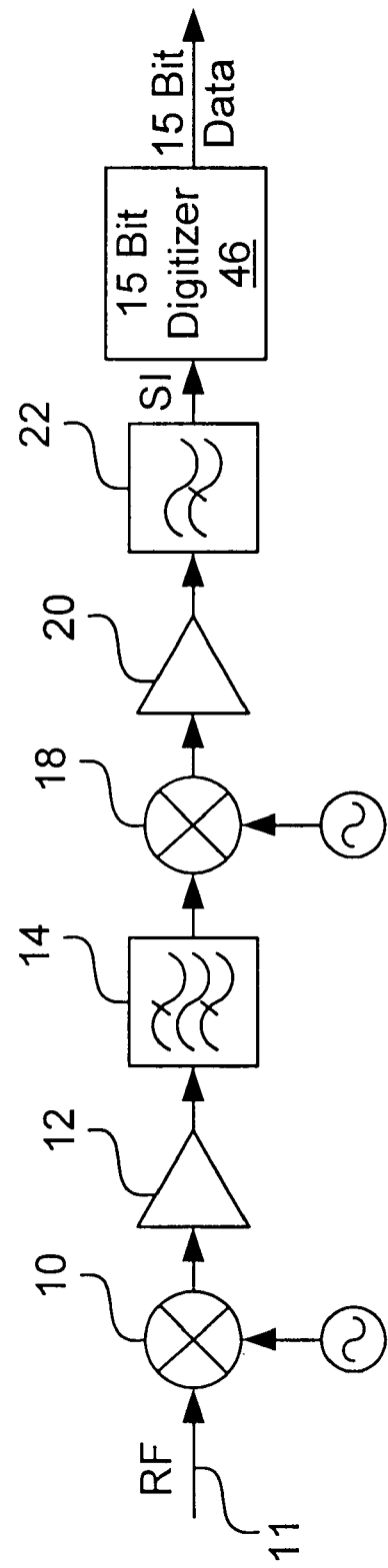
FIG. 3 is a block diagram of a wideband receiver according to an embodiment of the invention.

Referring now to FIG. 3, a wideband receiver according to an embodiment of the invention is shown to include the RF mixer 10, buffer 12, filter 14, IF mixer 18, buffer 20, and filter 22 all as previously introduced with respect to the conventional wideband receiver of FIG. 1. In place of the ADC 24 of FIG. 1, there is a 15-bit increased dynamic range digitizer 46 provided by an embodiment of the invention. The signal output by the filter 22 and input to the digitizer 46 is referred to as SI. Unlike the receiver of FIG. 1, there is no variable gain stage between the filter 14 and the mixer 18. There is no need for a digital processing block for providing a feedback signal to the variable gain stage since the variable gain stage does not exist.

Figure 4A:
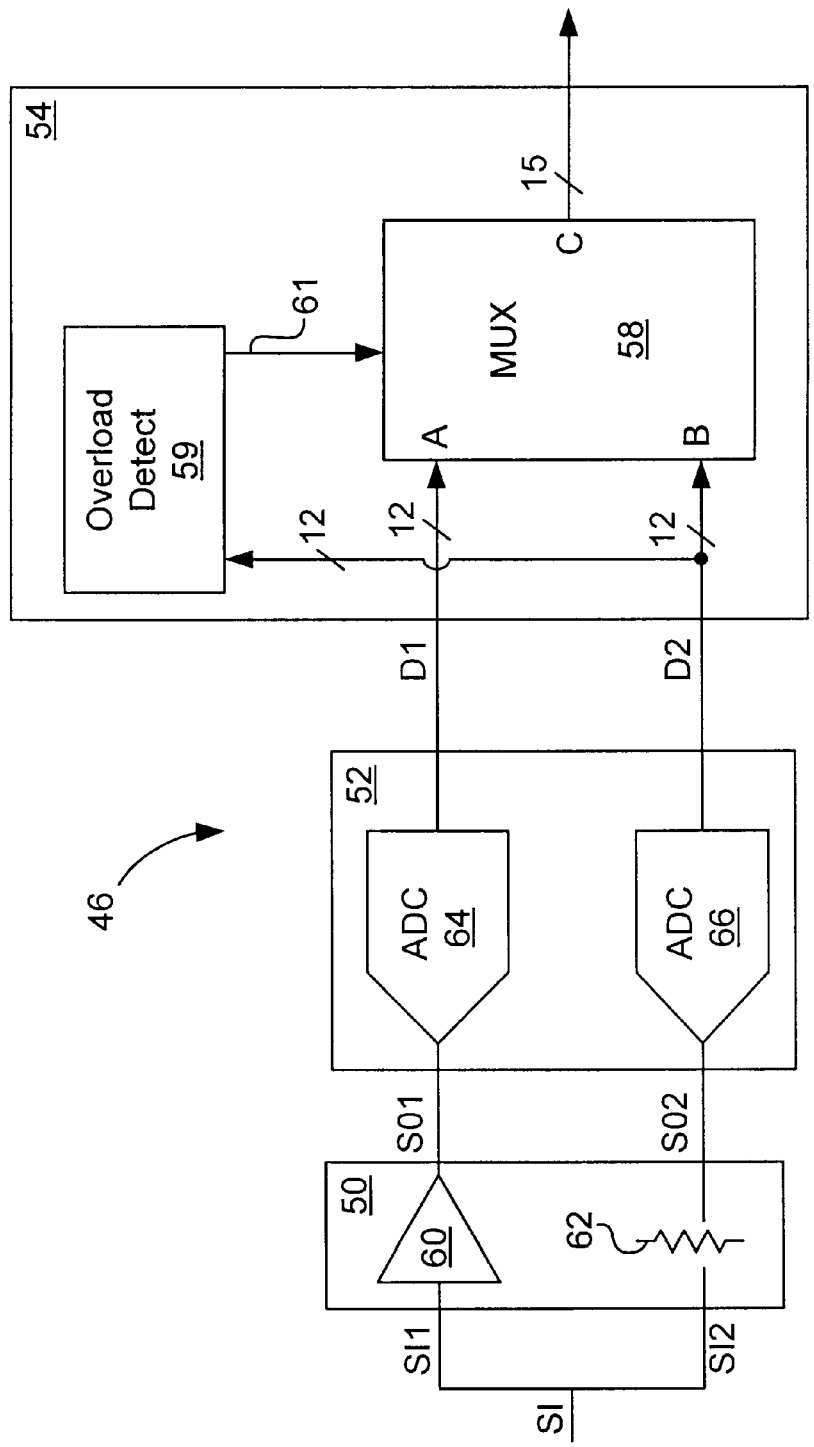
FIG. 4A is a block diagram of a digitizer with expanded dynamic range according to another embodiment of the invention.

Referring now to FIG. 4A, a 15-bit digitizer with increased dynamic range according to an embodiment of the invention is generally indicated by 46 and may, for example, be employed in the wideband receiver of FIG. 3 in which case the signal SI output by the filter 22 is input to the digitizer. Alternatively, the digitizer 46 may be used in other digitizing applications where increased dynamic range is required. The digitizer 46 includes a gain(attenuation) stage 50, an ADC stage 52, and a multiplexer stage 54. At the input to the gain(attenuation) stage 50, the input signal SI is split into two paths SI1, SI2 with some type of signal splitter (not shown, well known in the art). The first path SI1 is fed to an amplifier 60 in the gain(attenuation) stage 50, and the second path SI2 is fed to an attenuator 62 in the gain(attenuation) stage 50. The ADC stage 52 comprises a first ADC 64 and a second ADC 66, and the multiplexer stage 54 comprises a multiplexer 58 and an overload detect circuit 59. The amplifier 60 has an output SO1 which is digitized by the first ADC 64 in the ADC stage 52 and passed to a first input A of the multiplexer 58, and the attenuator 62 has an output SO2 which is digitized by the second ADC 66 in the ADC stage and passed to a second input B of the multiplexer.

It is assumed that for the purpose of this example that the ADCs 64,66 produce two's complement 12-bit digital representations of the analog signals they receive. The first bit of such a two's complement representation is a sign bit which is "0" for positive numbers and "1" for negative numbers. The remaining 11 bits will be referred to as the "value" bits. For positive numbers, the remaining 11 bits are a binary representation of the number. Positive numbers run from 000000000001 which represents +1 through to 01111111111which represents +2047. For negative numbers, the remaining 11 bits are a two's complement representation of the corresponding positive number determined by starting with the binary representation of the positive number, replacing ones with zeros, replacing zeros with ones and adding one. Negative numbers run from 111111111111 which represents −1 through to 100000000000 which represents −2048. The fact that two's complement ADCs are used has an effect on how the overload of the ADCs is detected as discussed in detail below. Other types of ADCs may be used in implementing the invention assuming the appropriate modifications to the overload detection circuitry are made.

It is a property of the ADCs 64,66 that each bit corresponds to $20 \log_{10}(2) = K = 6.0206$ dB. The difference between the gain in the amplifier 60 and the attenuation in the attenuator 62 is selected to be 3×K dB in this embodiment. The two ADCs 64,66 perform analog-to-digital conversion on their respective input signals SO1, SO2 to produce first and second 12-bit digitized signals D1, D2 at inputs A and B of the multiplexer 58. The first digitized signal D1 is a digitized version of the amplified signal SO1, and the second digitized signal D2 is a digitized version of the attenuated signal SO2. Subtracting 3×K dB from a signal with respect to another signal has the effect of shifting the value bits of the 12-bit representation three bits towards the least significant bit (LSB). For example, the following 12-bits form a two's complement representation of the number 55: 000000110111. Subtracting 3×K dB from 55 gives 6.875, the integer part of which is the number 6. The following is the two's complement representation of the number 6: 000000000110 which by inspection is the two's complement representation of the number 55 shifted to the right (towards the LSB) by exactly three bits. The same example would apply for negative numbers by simply replacing all zeros with ones and replacing all ones with zero, and adding one.

Thus the second 12-bit digitized signal D2 is a version of the first 12-bit digitized signal D1 shifted three bits towards the LSB. The overload detect circuit 59 is connected so as to monitor the output D2 of the second ADC 64, and to control through select line 61 an output C of the multiplexer 58 as discussed in detail below.

Figure 4B:
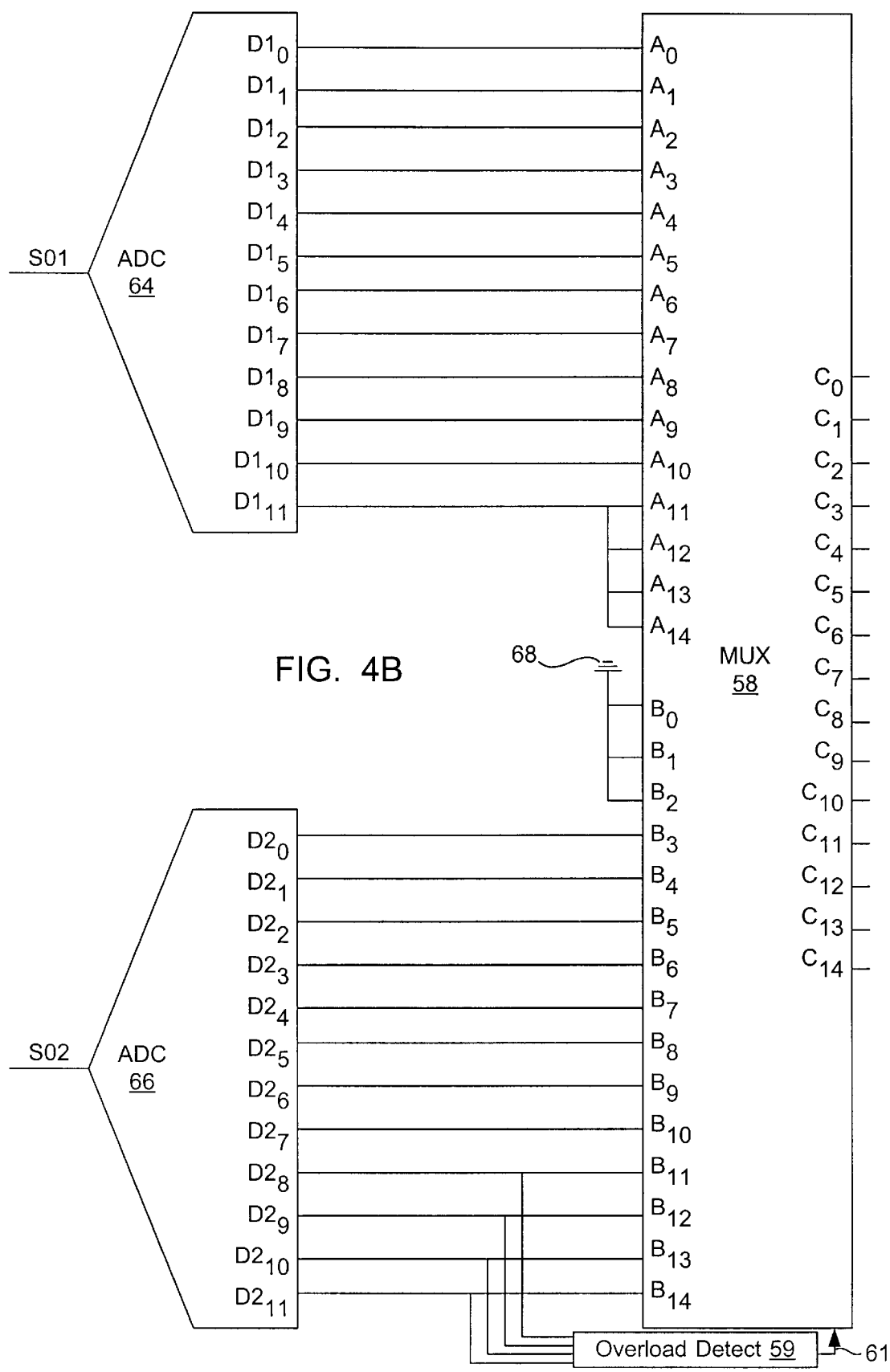
FIG. 4B is a block diagram showing details of connections shown in FIG. 4A between the analog-to-digital converters and the multiplexer and between the multiplexer and the overload detect circuit.

The connections between the ADCs 64,66 and the multiplexer 58 will be described in further detail with respect to FIG. 4B. The two inputs A, B of the multiplexer 58 are 15-bit inputs, labelled $A_0$ to $A_{14}$ and $B_0$ to $B_{14}$ respectively. The output D1 of the first ADC 64 is labelled $D1_0$ to $D1_{11}$, and the output D2 of the second ADC 66 is labelled $D2_0$ to $D2_{11}$. At input A, bits $D1_0$ to $D1_{11}$ are connected to input bits $A_0$ to $A_{11}$. In addition, the most significant bit $D1_{11}$ of D1 is connected to bits $A_{12}$, $A_{13}$, $A_{14}$ of input A. At input B, bits $D2_0$ to $D2_{11}$ are connected to bits $B_3$ to $B_{14}$ of input B. The output C of the multiplexer 58 is a 15-bit output labelled $C_0$ to $C_{14}$. In addition, bits $D2_8, D2_9, D2_{10}, D2_{11}$ are connected to the overload detect circuit 59.

When the overload detect circuit 59 detects through an analysis of bits $D2_8, D2_9, D2_{10}, D2_{11}$ that the first ADC 64 is not saturated, then the A input is selected to be passed through as the multiplexer output C. In this case, bits $C_0$–$C_{11}$ of the 15 bit output C will contain data, and bits $C_{12}$–$C_{14}$ will always contain bits equal to the sign bit of input A, namely bit $A_{11}$. When input A is selected, there is no noise or error introduced in extending the twelve bit representation of D1 to a fifteen bit representation because the three additional bits are known to equal the sign bit of A.

When the overload detect circuit 59 detects that the first ADC 64 is saturated, then input B is selected to be passed through as the multiplexer output C. In this case, bits $C_3$–$C_{14}$ will contain data equal to input bits $B_3$–$B_{14}$. When input B is selected, there will be noise introduced because the resolution provided by the contents of the three least significant bits $B_0$, $B_1$, $B_2$ will be lost since these bits are unknown. These three bits may be permanently connected to zero (ground 68). This will result on average in a slight underestimate of positive numbers and in a slight overestimate of negative numbers.

The second ADC 66 has an input signal SO2 which is 3×K dB less than that of the first ADC 64, and as such it will not saturate until the default input signal SO1 is at least 3×K dB larger than the nominal ADC saturation level. There are two cases in which the first ADC 64 will saturate and both of these are identifiable by examining the output of the second ADC 66. The input A will be $D1_{11}$ $D1_{11}$ $D1_{11}$ $D1_{11}$ $D1_{10}$ $D1_9$ $D1_8$ $D1_7$ $D1_6$ $D1_5$ $D1_4$ $D1_3$ $D1_2$ $D1_1$ $D1_0$. The B input will be $D2_{11}$ $D2_{10}$ $D2_9$ $D2_8$ $D2_7$ $D2_6$ $D2_5$ $D2_4$ $D2_3$ $D2_2$ $D2_1$ $D2_0$ 0 0 0 and the output C will be $C_{14}$ $C_{13}$ $C_{12}$ ... $C_0$.

If the input is positive ($B_{14}=D2_{11}=0$), then if any of $B_{13}$ $B_{12}$ or $B_{11}$ ($D2_{10}$, $D2_9$ or $D2_8$) are high then A is overloaded, since these would necessarily represent numbers larger that the range of A. Similarly, if the input is negative ($B_{14}=D2_{11}=1$), then if any of $B_{13}$ $B_{12}$ or $B_{11}$ ($D2_{10}$, $D2_9$, $D2_8$) are low then A is overloaded, since these would represent numbers below the most negative number A can handle. This can be summarized using Boolean logic as follows where OVLD represents the overload state, and is high if A is overloaded and low otherwise:

OVLD=(($D2_{10}$ OR $D2_9$ OR $D2_8$) AND NOT $D2_{11}$) OR ((NOT $D2_{10}$ OR NOT $D2_9$ OR NOT $D2_8$) AND $D2_{11}$)

An example realization of an overload detect circuit 59 which realizes the above logic is shown in FIG. 4C and includes a 3-input OR gate 70 and a 3-input OR gate 72 with inverted inputs, both connected to received $D2_{10}$, $D2_9$, and $D2_8$ as inputs. Each OR gate 70,72 has an output connected to a first input of a respective 2-input AND gate 74,76, with the second input of AND gate 74 being an inverted input. Bit $D2_{11}$ is connected to the inverted input of AND gate 74 and to the remaining input of AND gate 76. Both AND gates 74,76 have outputs connected to the input of an OR gate 78. The OR gate 78 produces an output OVLD satisfying the above expressed Boolean logic equation.

The overload detect circuit 59 preferably also includes a hysteresis functional block 72. In the absence of the hysteresis block 72, a high OVLD output would select input B and a low OVLD output would select input A, in both cases through a signal to the multiplexer 58 on select line 61. The hysteresis functional block 72 is provided to avoid a high rate of toggle between input A and input B. A high rate of toggle is undesirable because in a practical realization, the gain (attenuation) difference between inputs A and B may not be exactly 3×K dB, and the variation from this figure will cause spectral splatter. The energy of the splatter can be reduced by holding input B for a fixed amount of time independent of overload duration, for example 1 ms.

In non-saturation conditions, bits $C_3$–$C_{11}$ of the bit stream at output C are unchanged when A or B is selected. When the path B is selected, the three least significant bits, bits $C_0$–$C_2$, will always contain zeros, and this will translate into a small amount of noise. Thus, in non-saturation conditions, it is preferable to use input A.

Figure 4D:
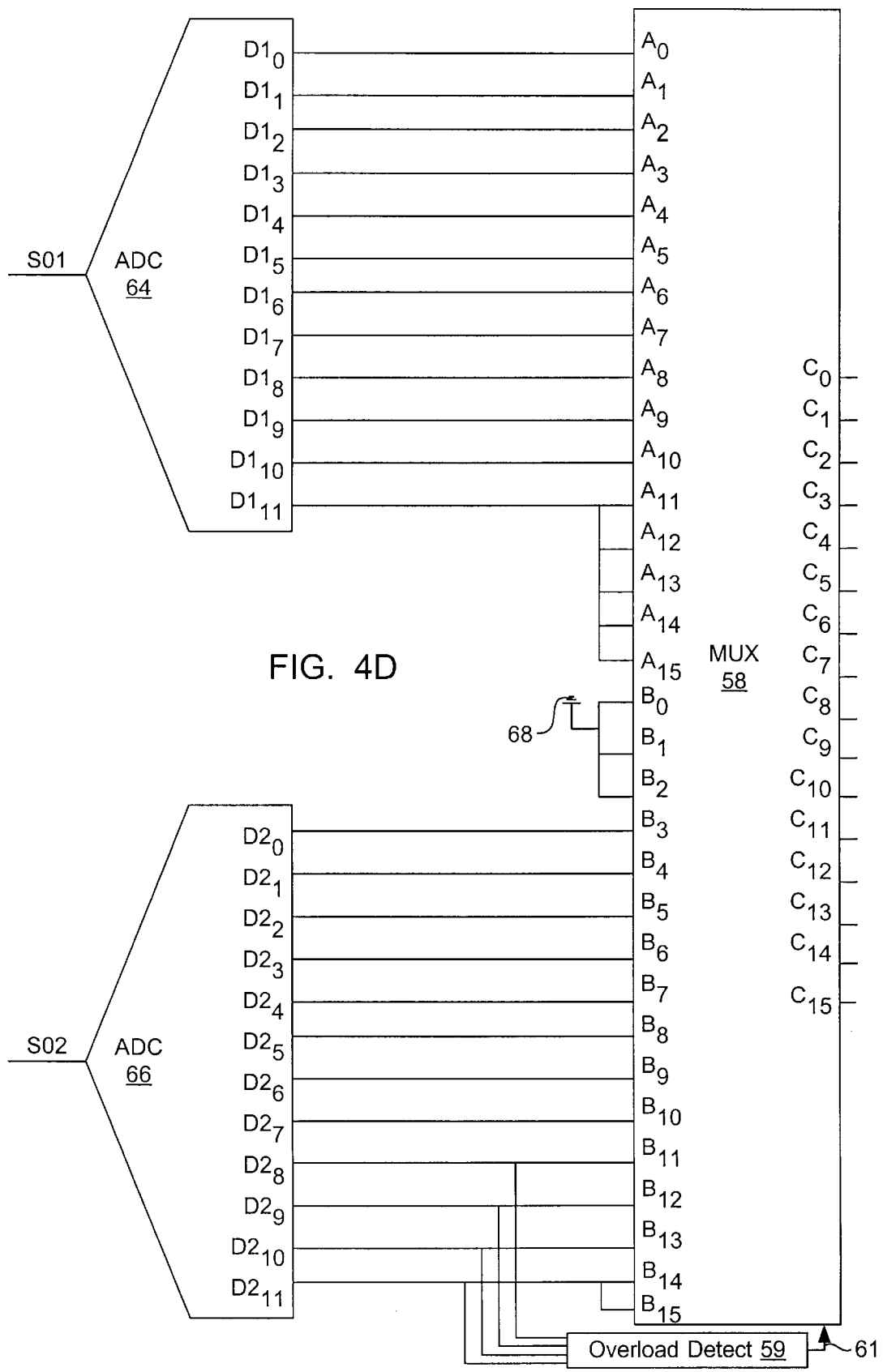
FIG. 4D is a block diagram showing details of connections shown in FIG. 4A between the analog-to-digital converters and the multiplexer and between the multiplexer and the overload detect circuit in which 16-bit logic is employed.

In the above embodiment, 15-bit digital representations are produced and as such all subsequent circuitry must be selected to handle 15-bit samples. Preferably, 16-bit samples are produced since 16-bit circuitry is more readily available. Referring to FIG. 4D, a version of FIG. 4B, is shown which results in 16-bit signals. Input A has an additional input bit $A_{15}$ which is connected to receive $D1_{11}$. Input B has an additional input $B_{15}$ which is connected to receive bit $D2_{11}$. Output C has an additional bit $C_{15}$. The overload detect circuit 59 connections do not change.

Figure 5:
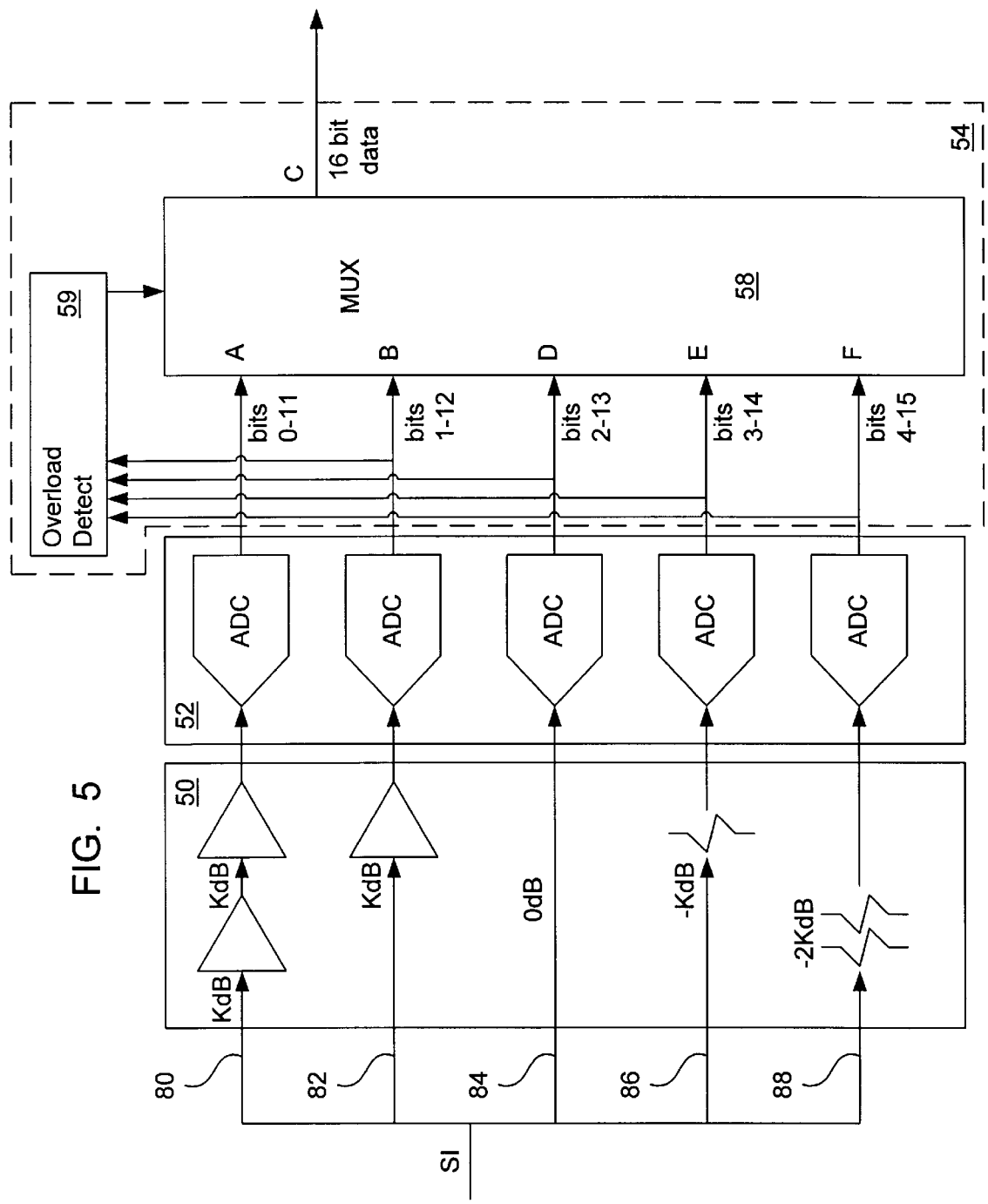
FIG. 5 is a block diagram of a digitizer according to another embodiment of the invention.

In the above example, the improved digitizer has divided the input signal into two paths with a gain/attenuation difference of 3×K dB, and it is assumed that 12-bit ADCs are employed. More generally, the improved system may be designed with an arbitrary number, N, of paths each preferably differing in attenuation/gain from each other by multiples of K dB. The overload detect circuit must select the highest gain (least attenuated) path which does not result in an overload of the respective ADC. The ADCs may not necessarily be 12-bit ADCs, but may have some other nominal bit count, M. The number of bits, P, required at the multiplexer will be the nominal ADC bit count, M, plus a number of bits equal to (maximum gain−maximum attenuation)/K dB, where "maximum gain" and "maximum attenuation" are respectively the largest and smallest of the gains (attenuations) inserted in any of the paths. An example of this is shown in FIG. 5 where a digitizer which splits an input signal SI into N=five different paths 80,82,84,86,88 is shown. The gain (attenuation) stage adds 2×K dB, K dB, 0 dB, −K dB, −2×K dB of gain (attenuation) in each of the five paths 80,82,84,86,88 respectively. The maximum gain is 2×K dB, and the maximum attenuation is −2×K dB, therefore (2×K−(−2×K))/K=4 additional bits are required. The gain (attenuation) stage 50 produces five compensated outputs which are passed to five ADCs in the ADC stage 52, each ADC having a nominal 12-bit count. The ADC stage 52 has five digitized outputs connected to input A,B,D,E and F of the multiplexer 58. Since each ADC has a M=12 bit nominal bit count, the multiplexer 58 must handle P=12+4=16 bit signals. The digitized outputs are connected to bits 0-11, 1-12, 2-13, 3-14, and 4-15 of inputs A,B,D,E and F respectively. Again, assuming two's complement ADCs, the MSB of the actual signal input at each of A,B,D,E,F will be copied to the remaining more significant bits. For example, the MSB of A will be bit 11 and this is copied to bits 12,13,14 at input A. More generally, the multiplexer has N P-bit inputs each numbered bit 0 through bit P−1, and each ADC is connected to its respective multiplexer input at only M of the possible P bits, namely bit X through bit X+M−1, where X is the lowest numbered bit to which a connection is made, and where X is determined according to:

X=maximum gain (lowest attenuation) of any channel−gain(attenuation) of the particular channel)/K dB.

Furthermore, for cases where the output samples are to be padded such that a convenient sample size is achieved (for example as shown in FIG. 4D) the P-bit output sample forms a subrange of an R-bit output sample, where R>P, with the switching circuitry connecting the R-P most significant bits of the R-bit sample to be equal to the most significant bit the P-bit sample.

The overload detect circuit 59 selects one of inputs A,B,D,E,F to be passed through the multiplexer 58. If path A is saturated, then path B is checked, and if unsaturated, path B is selected. If path B is also saturated, then path D is checked, and if unsaturated, path D is selected. If path D is also saturated, then path E is checked, and if unsaturated, path E is selected. If path E is also saturated, then path F is selected.

The overload detect circuit identifies whether a particular analog-to-digital converter is saturated by determining whether another analog-to-digital converter whose input is attenuated relative to that of the particular analog-to-digital converter is producing an output which is outside the range of that representable by the particular analog-to-digital converter.

The ADCs used in the digitizer with increased dynamic range may for example be Analog Devices part AD6640 12-bit ADC which has the ability to digitize up to 32 MHZ of spectrum. It has a nominal dynamic range of 72 dB. When used with the embodiment of FIG. 4A for example, the dynamic range of the resulting digitizer is increased to 72 dB+~18dB≈90 dB.

The AD6640 produces a full scale output with a 1 Vpp (volts peak-to-peak) input signal. Referring again to the example of FIG. 4A in which two paths are employed with a gain (attenuation) difference of −18 dB are used, assume that the gains in the two paths are 40 dB and 22 dB respectively. Using two Analog Devices AD6640 ADCs in an increased dynamic range digitizer, an RF input signal having −36 dBm received through an antenna input having a 50 Ω input impedance and 40 dB voltage gain would result in a 1 Vpp full scale signal at the first ADC input. In other words, any signal larger than −36 dBm received by the receiver will result in the first ADC saturating, and in the selection of the second ADC. The second ADC will be able to handle received signals having strengths up to −18 dBm without saturating.

It is noted that since the output of the digitizer with increased dynamic range has more bits per sample than the conventional ADC, subsequent components in the receiver must be selected to handle these larger samples. For example, channelizer functionality may follow the digitization stage, and the channelizer must be designed to accomodate 15-bit samples. This does not entail a re-design, but rather entails simply selecting available off-the-shelf components having the capacity to handle the increased sample size.

In the above described example, it has been assumed that each amplifier or attenuator has a gain equal to an exact multiple of $K=20 \log_{10}(2)$. Depending upon the amount of gain or attenuation, there is some tolerance in this value. For the example of FIG. 4A in which there is a single path with an attenuation nominally equal to $3 \times K = 18.0618$ dB, the three bit shifting will perform perfectly for any attenuations in the range 18.0533 dB to 18.1901 dB. For attenuations outside these ranges an error will occur when the shift is performed. For example, a perfectly attenuated version of a number normally digitized as 1023 will be digitized as 127, this being 1023 shifted to the right three bits. However, it will be digitized as 126 for attenuations which are too large (above 18.1901 dB), and it will be digitized as 128 for attenuations which are too small (below 18.0533 dB). Thus some care must be taken to ensure that these gains and attenuations are sufficiently accurate.

Numerous modifications and variations of the present invention are possible in light of the above teachings. It is therefore to be understood that within the scope of the appended claims, the invention may be practised otherwise than as specifically described herein.

In the above described examples, it is assumed that two's complement ADCs are used. Of course other types of ADCs such as one's complement ADCs, for example may alternatively be used. This would necessitate changing the overload detect circuit and changing the connections between the ADCs and the multiplexer.

In the above described example, a multiplexer is used to channel one of two inputs through to an output. Of course this would be done using any suitable switching circuitry.

While in the illustrated embodiment, the multiplexer is shown as having P-bit inputs, it is to be understood that it could instead simply have M-bit inputs provided that the appropriate inputs bits are routed to the appropriate output bits depending upon the input selected.

We claim:

1. A digitizer with increased dynamic range having an analog input and a digitized output consisting of P-bit samples, the digitizer comprising:
   a gain(attenuation) stage having N channels, each for applying a respective gain or attenuation to said analog input to produce a respective scaled analog signal, where N is an integer greater than or equal to two;
   N M-bit analog-to-digital converters, each connected to receive a respective one of said scaled analog signals, each for producing a respective M-bit digital sample of the respective one of the scaled analog signals, where M is the sample bit length of the M-bit analog-to-digital converters;
   a switching circuitry connected to receive as inputs all of said respective M-bit digital samples, for outputting one of the P-bit samples as a function of a selected one of the respective M-bit digital samples, where P>M;
   an overload detect circuit for selecting the selected one of the respective M-bit digital samples;
   the overload detect circuit comprising a hysteresis functional block which prevents the switching circuitry from switching between analog-to-digital converters at too rapid a frequency.

2. A digitizer according to claim 1 wherein said respective gain or attenuation in the N channels all differ from each other by amounts substantially equal to multiples of K=6.0206 dB.

3. A digitizer according to claim 2 wherein P−M is equal to (maximum of said different attenuation/gains in dB minus the minimum of said different attenuation/gains in dB) divided by K dB.

4. A digitizer according to claim 1 wherein said overload detect circuit selects the respective M-bit digital sample which was produced in the channel having the largest gain or least attenuation of channels having unsaturated analog-to-digital converters.

5. A digitizer according to claim 4 wherein said overload detect circuit identifies whether a particular analog-to-digital converter is saturated by determining whether another analog-to-digital converter whose input is attenuated relative to that of the particular analog-to-digital converter is producing an output which is outside the range of the particular analog-to-digital converter.

6. A digitizer according to claim 1 wherein the analog-to-digital converters produce two's complement digital representations of their inputs.

7. A digitizer with increased dynamic range having an analog input and a digitized output consisting of P-bit samples, the digitizer comprising:
   a gain (attenuation) stage having N channels, each for applying a respective gain or attenuation to said analog input to produce a respective scaled analog signal, where N is an integer greater than or equal to two;
   N M-bit analog-to-digital converters, each connected to receive a respective one of said scaled analog signals, each for producing a respective M-bit digital sample of the respective one of the scaled analog signals, where M is the sample bit length of the M-bit analog-to-digital converters;
   a switching circuitry connected to receive as inputs all of said respective M-bit digital samples, for outputting one of the P-bit samples as a function of a selected one of the respective M-bit digital samples, where P>M;
   an overload detect circuit for selecting the selected one of the respective M-bit digital samples;
   wherein N=2, M=12, and P=15, and said respective gain or attenuation in the N=2 channels differ by approximately 18.0618 dB.

8. A digitizer according to claim 7 wherein said overload detect circuit selects the respective M-bit digital sample which was produced in the channel having the largest gain or least attenuation of channels having unsaturated analog-to-digital converters.

9. A digitizer according to claim 8 wherein said overload detect circuit identifies whether a particular analog-to-digital converter is saturated by determining whether another analog-to-digital converter whose input is attenuated relative to that of the particular analog-to-digital converter is producing an output which is outside the range of the particular analog-to-digital converter.

10. A digitizer with increased dynamic range having an analog input and a digitized output consisting of P-bit samples, the digitizer comprising:

a gain (attenuation) stage having N channels, each for applying a respective gain or attenuation to said analog input to produce a respective scaled analog signal, where N is an integer greater than or equal to two;

N M-bit analog-to-digital converters, each connected to receive a respective one of said scaled analog signals, each for producing a respective M-bit digital sample of the respective one of the scaled analog signals, where M is the sample bit length of the M-bit analog-to-digital converters;

a switching circuitry connected to receive as inputs all of said respective M-bit digital samples, for outputting one of the P-bit samples as a function of a selected one of the respective M-bit digital samples, where P>M;

an overload detect circuit for selecting the selected one of the respective M-bit digital samples;

wherein said respective attenuation or gain in the N channels all differ from each other by amounts substantially equal to multiples of K=6.0206 dB;

wherein P−M is equal to (maximum of said different attenuation/gains in dB minus the minimum of said different attenuation/gains in dB) divided by K dB;

wherein the P-bit output sample forms a subrange of an R-bit output sample, where R>P, and the switching circuitry connects the R-P most significant bits of the R-bit output sample to be equal to the most significant bit of the P-bit output sample.

11. A digitizer according to claim 6 wherein the switching circuit comprises a multiplexer having N R-bit inputs, each R-bit input having R input bits numbered input bit 0 through input bit R−1, and wherein each analog-to-digital converter is connected to pass its respective M-bit sample to a respective one of the R-bit inputs at input bit X through input bit X+M−1, where X is the lowest numbered input bit to which a connection is made, and where X is determined according to:

X=(maximum gain/attenuation of any channel minus gain/attenuation of the particular channel) divided by K dB.

12. A digitizer with increased dynamic range having an analog input and a digitized output consisting of P-bit samples, the digitizer comprising:

a gain (attenuation) stage having N channels, each for applying a respective gain or attenuation to said analog input to produce a respective scaled analog signal, where N is an integer greater than or equal to two;

N M-bit analog-to-digital converters, each connected to receive a respective one of said scaled analog signals, each for producing a respective M-bit digital sample of the respective one of the scaled analog signals, where M is the sample bit length of the M-bit analog-to-digital converters;

a switching circuitry connected to receive as inputs all of said respective M-bit digital samples, for outputting one of the P-bit samples as a function of a selected one of the respective M-bit digital samples, where P>M;

an overload detect circuit for selecting the selected one of the respective M-bit digital samples;

wherein said respective attenuation or gain in the N channels all differ from each other by amounts substantially equal to multiples of K=6.0206 dB;

wherein P−M is equal to (maximum of said different attenuation/gains in dB minus the minimum of said different attenuation/gains in dB) divided by K dB;

wherein the switching circuit comprises a multiplexer having N P-bit inputs, each P-bit input having input bits numbered input bit 0 through input bit P−1, and wherein each analog-to-digital converter is connected to pass its respective M-bit sample to a respective one of the P-bit inputs at input bit X through input bit X+M−1, where X is the lowest numbered input bit to which a connection is made, and where X is determined according to:

X=(maximum gain/attenuation of any channel minus gain/attenuation of the particular channel) divided by K dB.

13. A digitizer according to claim 12 wherein said overload detect circuit selects the digitized version of the largest of said scaled analog signals which does not saturate the respective analog-to-digital converter, wherein a particular analog-to-digital converter is identified as being saturated by determining whether another analog-to-digital converter whose input is attenuated relative to that of the particular analog-to-digital converter is producing an output which is outside the range of the particular analog-to-digital converter, and wherein said overload detect circuit comprises a hysteresis functional block which prevents the multiplexer form switching between ADCs at too rapid a frequency.

14. A digitizer according to claim 13 wherein N=2, M=12, and P=15, and said respective gain or attenuation in the N=2 channels differ by approximately 18.0617 dB.

15. A digitizer with increased dynamic range having an analog input and a digitized output consisting of P-bit samples, the digitizer comprising:

a gain (attenuation) stage having N channels, each for applying a respective gain or attenuation to said analog input to produce a respective scaled analog signal, where N is an integer greater than or equal to two;

N M-bit analog-to-digital converters, each connected to receive a respective one of said scaled analog signals, each for producing a respective M-bit digital sample of the respective one of the scaled analog signals, where M is the sample bit length of the M-bit analog-to-digital converters;

a switching circuitry connected to receive as inputs all of said respective M-bit digital samples, for outputting one of the P-bit samples as a function of a selected one of the respective M-bit digital samples, where P>M;

an overload detect circuit for selecting the selected one of the respective M-bit digital samples;

wherein the analog-to-digital converters produce two's complement digital representations of their inputs;

wherein the switching circuitry comprises a multiplexer having N P-bit inputs each numbered bit 0 through bit P−1, and wherein each analog-to-digital converter is connected to a respective one of the multiplexer input at only M of the possible P bits, namely bit X through bit X+M−1, where X is the lowest numbered bit to which a connection is made, and where X is determined according to:

X=(maximum gain/attenuation of any channel−gain/attenuation of the particular channel)/K dB, and wherein bit M of each M-bit sample is a sign bit, and wherein said switching circuitry copies the sign bit to bits X+M through P of the respective input.

16. A digitizer according to claim 15 wherein the P-bit output sample forms a subrange of an R-bit sample, where R>P, and the switching circuitry connects the R-P most significant bits of the R-bit sample to be equal to the most significant bit of the P-bit sample.

17. A digitizer with increased dynamic range having an analog input and a digitized output consisting of P-bit samples, the digitizer comprising:
- a gain (attenuation) stage having N channels, each for applying a respective gain or attenuation to said analog input to produce a respective scaled analog signal, where N is an integer greater than or equal to two;
- N M-bit analog-to-digital converters, each connected to receive a respective one of said scaled analog signals, each for producing a respective M-bit digital sample of the respective one of the scaled analog signals, where M is the sample bit length of the M-bit analog-to-digital converters;
- a switching circuitry connected to receive as inputs all of said respective M-bit digital samples, for outputting one of the P-bit samples as a function of a selected one of the respective M-bit digital samples, where P>M;
- an overload detect circuit for selecting the selected one of the respective M-bit digital samples;
- wherein N=2, M=12, and P=15, and said respective gain or attenuation in the N=2 channels differ by approximately 18.0618 dB, and the P=15 bit output sample forms a subrange of a 16-bit output sample, with the switching circuitry connecting the most significant bit of the 16-bit output sample to be equal to the most significant bit of the 15-bit output sample.

18. A digitizer with increased dynamic range having an analog input and a digitized output consisting of P-bit samples, the digitizer comprising:
- a gain (attenuation) stage having N channels, each for applying a respective gain or attenuation to said analog input to produce a respective scaled analog signal, where N is an integer greater than or equal to two;
- N M-bit analog-to-digital converters, each connected to receive a respective one of said scaled analog signals, each for producing a respective M-bit digital sample of the respective one of the scaled analog signals, where M is the sample bit length of the M-bit analog-to-digital converters;
- a switching circuitry connected to receive as inputs all of said respective M-bit digital samples, for outputting one of the P-bit samples as a function of a selected one of the respective M-bit digital samples, where P>M;
- an overload detect circuit for selecting the selected one of the respective M-bit digital samples;
- said overload detect circuit selects the respective M-bit digital sample which was produced in the channel having the largest gain or least attenuation of channels having unsaturated analog-to-digital converters;
- wherein said overload detect circuit identifies whether a particular analog-to-digital converter is saturated by determining whether another analog-to-digital converter whose input is attenuated relative to that of the particular analog-to-digital converter is producing an output which is outside the range of the particular analog-to-digital converter;
- wherein said overload detect circuit comprises a hysteresis functional bock which prevents the switching circuitry from switching between analog-to-digital converters at too rapid a frequency.

19. A wideband receiver comprising: circuitry for down converting a received analog RF signal into a baseband signal;
- digitizer with increased dynamic range connected to receive said baseband signal as its input, for producing a digitized output consisting of P-bit samples, the digitizer comprising:
  - a gain/attenuation stage for applying a different gain or attenuation to each of a plurality N of channels containing said analog input each producing a respective scaled analog signal, where N is an integer grater than or equal to two;
  - N M-bit analog-to-digital converters, each connected to receive a respective one of said scaled analog signals, each for producing a respective M-bit digital sample of the respective analog signal, where M is the sample bit length of the analog-to-digital converters;
  - a multiplexer connected to receive as inputs all of the respective M-bit digital samples and to pass a selected one of the samples on as a sub-range of one of said P-bit samples, where K>M; and
  - an overload detect circuit for selecting the selected one of said respective M-bit digital samples comprising a hysteresis functional block which prevents switching between analog-to-digital converters at too rapid a frequency.

* * * * *